(12) United States Patent
Li et al.

(10) Patent No.: US 6,822,395 B2
(45) Date of Patent: Nov. 23, 2004

(54) DEVICES FOR CONTROLLING ELECTRON EMISSION IN PLASMA FLOOD SYSTEM

(75) Inventors: Ming-Hsing Li, Tainan (TW); Min-Tsung Lee, Pintung (TW); Keneth Lin, Kaosiung (TW); Yow-Te Tsai, Kaohsiung (TW); Huang-Ta Huang, Itan (TW); Chao-Chun Chen, Tainan (TW); Huei-Mei Jao, Junghe (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/233,842

(22) Filed: Sep. 3, 2002

(65) Prior Publication Data
US 2004/0051465 A1 Mar. 18, 2004

(51) Int. Cl.$^7$ .............................. H01J 7/24; C23C 14/00
(52) U.S. Cl. .............................. 315/111.21; 309/192.12
(58) Field of Search .................. 315/111.21, 111.71, 315/111.81, 111.91, 111.31; 250/492.21, 492.3, 492.2, 251, 398; 209/192.11, 192.12, 192.29; H01J 7/24

(56) References Cited

U.S. PATENT DOCUMENTS

| | | | | |
|---|---|---|---|---|
| 4,361,762 A | * | 11/1982 | Douglas | 250/251 |
| 4,931,158 A | * | 6/1990 | Bunshah et al. | 204/192.29 |
| 5,003,178 A | * | 3/1991 | Livesay | 250/492.3 |
| 5,014,553 A | * | 5/1991 | Hori et al. | 73/295 |
| 5,399,871 A | * | 3/1995 | Ito et al. | 250/492.21 |
| 6,100,536 A | * | 8/2000 | Ito et al. | 250/492.21 |
| 6,285,025 B1 | * | 9/2001 | Metel et al. | 250/251 |

* cited by examiner

Primary Examiner—Don Wong
Assistant Examiner—Trinh Vo Dinh
(74) Attorney, Agent, or Firm—Tung & Associates

(57) ABSTRACT

A device for controlling emission of electrons from an arc chamber of a plasma flood system into an ion beam in an ion implanter for implanting ions into a substrate. In one embodiment, the invention comprises a mechanical shutter disposed in a discharge opening between the arc chamber and the plasma guide tube of the implanter. The bore size of the shutter can be selectively varied in order to control the emission of electrons from the arc chamber into the ion beam in the plasma guide tube. In another embodiment, the invention comprises an electron-attracting probe which is disposed in the discharge opening.

10 Claims, 3 Drawing Sheets

DEVICES FOR CONTROLLING ELECTRON EMISSION IN PLASMA FLOOD SYSTEM

FIELD OF THE INVENTION

The present invention relates to hi-current implanters used to implant ions in semiconductor wafer substrates in the fabrication of semiconductor integrated circuits on the substrates. More particularly, the present invention relates to devices for controlling the quantity of electrons emitted from a PFS (plasma flood system) arc chamber into an ion beam in order to reduce or control surface charges on a substrate during an ion implantation process.

BACKGROUND OF THE INVENTION

In the semiconductor production industry, various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Ion implantation is another processing step commonly used in the fabrication of the integrated circuits on the wafer. Ion implantation is a form of doping, in which a substance is embedded into the crystal structure of the semiconductor substrate to modify the electronic properties of the substrate. Ion implantation is a physical process which involves driving high-energy ions into the substrate using a high-voltage ion bombardment. The process usually follows the photolithography step in the fabrication of the circuits on the wafer.

The ion implantation process is carried out in an ion implanter, which generates positively-charged dopant ions in a source material. A mass analyzer separates the ions from the source material to form a beam of the dopant ions, which is accelerated to a high velocity by a voltage field. The kinetic energy attained by the accelerated ions enables the ions to collide with and become embedded in the silicon crystal structure of the substrate. Finally, the doped silicon substrate is subjected to a thermal anneal step to activate the dopant ions.

A phenomenon which commonly results from the ion implantation process is wafer charging, in which positive ions from the ion beam strike the wafer and accumulate in the masking layer. This can cause an excessive charge buildup on the wafer, leading to charge imbalances in the ion beam and beam blow-up, which results in substantial variations in ion distribution across the wafer. The excessive charge buildup can also damage surface oxides, including gate oxides, leading to device reliability problems, as well as cause electrical breakdown of insulating layers within the wafer and poor device yield.

Wafer charging is controlled using a plasma flood system (PFS), in which the wafer is subjected to a stable, high-density plasma environment. Low-energy electrons are extracted from an argon or xenon plasma in an arc chamber and introduced into the ion beam, which carries the electrons to the wafer so that positive surface charges on the wafer are neutralized. The energy of the electrons is sufficiently low to prevent negative charging of the wafer.

A typical conventional PFS (plasma flood system) for neutralizing positive charges on ion-implanted wafers is generally indicated by reference numeral 10 in FIG. 1 and includes an arc chamber 12 having a cylindrical chamber wall 14. A single gas inlet opening 18 is provided in the chamber wall 14. A low voltage source 20 generates a typically 3-volt, 200-amp current through a tungsten filament 22 positioned in the chamber interior 13. Pressure inside the chamber interior 13 is maintained at about 5 Torr. Simultaneously, by operation of vacuum pressure induced in the arc chamber 12, a plasma-forming gas such as argon or xenon is introduced into the chamber interior 13 through the gas opening 18, at a flow rate of typically about 1.2 sccm. The filament 22, heated by the low-voltage current from the current source 20, causes thermionic emission of electrons from the flowing gas as the gas contacts the filament 22. The electrons from the gas are electrically attracted to the positively-charged chamber walls 14, which function as an anode. A torroidal magnet 16 generates a magnetic field which causes the electrons to travel in a spiral flight path in the chamber interior 13, and this increases the frequency of collisions between the electrons and the gas atoms, resulting in the creation of additional free electrons. The electrons and positive ions are drawn from the chamber interior 13 through a discharge opening 24, where the electrons, cations and a surrounding plasma 28 enter an ion beam 26 in a beam guide tube 11. The ion beam 26 carries the electrons into contact with a semiconductor wafer (not shown) which was previously subjected to an ion implantation process. Accordingly, the electrons contact the wafer and neutralize positive ions remaining on the surface of the wafer after the ion implantation process.

The system parameters of the PFS 10 are set by recipe and are not variable, so the surface charge condition of the wafer cannot be changed. Consequently, an excessive number of electrons may bombard the surface of the wafer such that the electrons not only neutralize the positive charges on the wafer surface but impart a net negative charge to the wafer. Accordingly, a device is needed for varying the size of the discharge opening 24 in order to achieve a slight positive or neutral charge to the wafer after the ion implantation process.

An object of the present invention is to provide a device for varying the quantity of electrons entering an ion beam in an ion implanter.

Another object of the present invention is to provide a device for preventing excessive negative charging of a substrate during an ion implantation process.

Still another object of the present invention is to provide a device for controlling emission of electrons in a plasma flood system (PFS) for an ion implanter.

Another object of the present invention is to provide a device for mechanically controlling emission of electrons in a PFS for an ion implanter.

A still further object of the present invention is to provide a device for electrically controlling emission of electrons in a PFS for an ion implanter.

Yet another object of the present invention is to provide a mechanical shutter for controlling emission of electrons in a plasma flood system.

A still further object of the present invention is to provide an electron-attracting probe for varying emission of electrons into an ion beam from an arc chamber of a plasma flood system.

SUMMARY OF THE INVENTION

In accordance with these and other objects and advantages, the present invention comprises a device for controlling emission of electrons from an arc chamber of a plasma flood system into an ion beam in an ion implanter for implanting ions into a substrate. In one embodiment, the invention comprises a mechanical shutter disposed in a discharge opening between the arc chamber and the plasma guide tube of the implanter. The bore size of the shutter can be selectively varied in order to control the emission of electrons from the arc chamber into the ion beam in the plasma guide tube. In another embodiment, the invention comprises an electron-attracting probe which is disposed in the discharge opening. By varying the strength of the positive charge applied to the probe, the number of emitted electrons which bind to the probe can be varied. This, in turn, controls the number of electrons which enter the ion beam and flood the surface of the substrate.

BRIEF DESCRIPTION OF THE DRAWINGS

The invention will now be described, by way of example, with reference to the accompanying drawings, in which.

DESCRIPTION OF THE PREFERRED EMBODIMENTS

Figure 1:
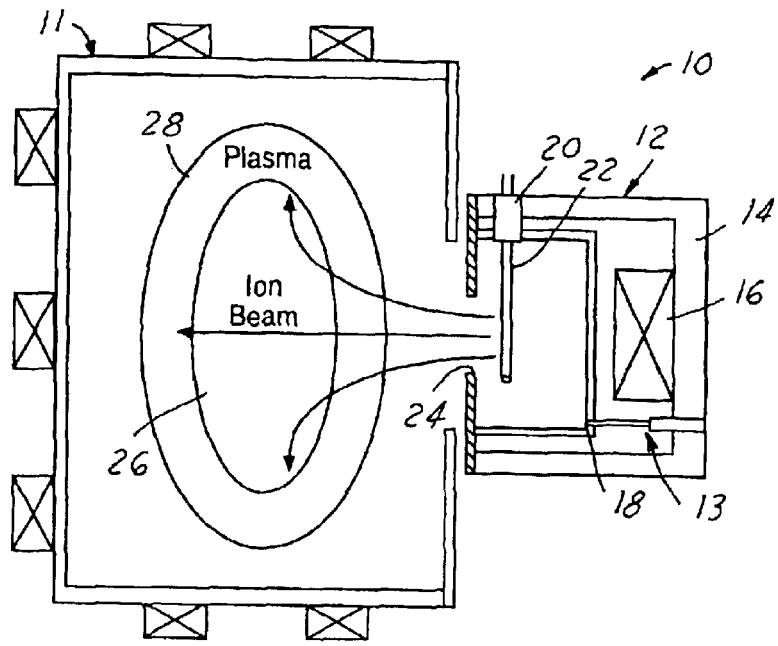
FIG. 1 is a schematic view illustrating a conventional plasma flood system (PFS)
Figure 2:
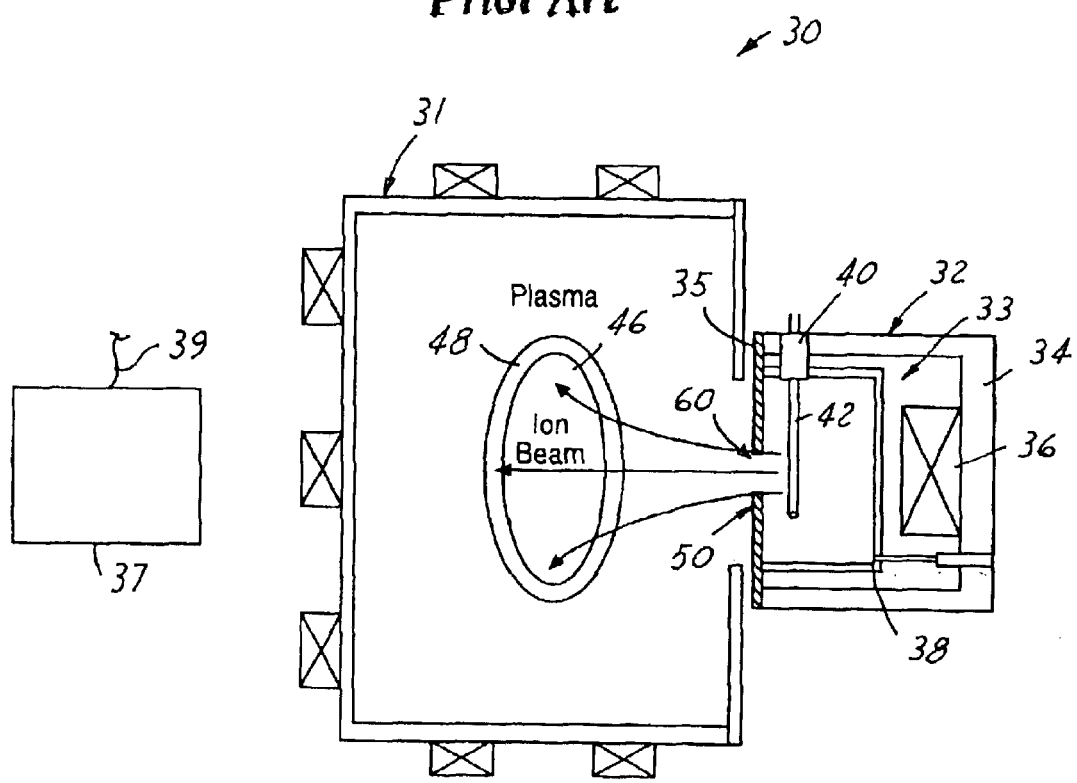
FIG. 2 is a schematic view illustrating a plasma flood system in implementation of an embodiment of the present invention.

The present invention has particularly beneficial utility in controlling flow of electrons from an arc chamber of a plasma flood system into an ion beam in the implantation of ions into substrates. However, the invention is not so limited in application, and while references may be made to such plasma flood systems and ion implanters, the invention may be more generally applicable to controlling electron flow in a variety of applications.

Referring initially to FIGS. 2–4B, an illustrative embodiment of a plasma flood system in implementation of the present invention is generally indicated by reference numeral 30. The PFS 30 includes an arc chamber 32 having a typically cylindrical chamber wall 34. One or multiple gas inlet openings 38 are provided in the chamber wall 34 for introducing argon or other plasma-forming gas into the chamber interior 33. A voltage source 40 is electrically connected to a filament 42 which may be tungsten and is positioned in the chamber interior 33. A torroidal magnet 36 may encircle the chamber interior 33. The PFS 30 may be automatically operated by a controller 37. A partition 35 separates the arc chamber 32 from a beam guide tube 31 of the PFS 30. A discharge opening (not shown) is provided in the partition 35 for facilitating flow of electrons from the arc chamber 32 into an ion beam 46 in the beam guide tube 31, in operation of the PFS 30 as hereinafter described.

Figure 3A:
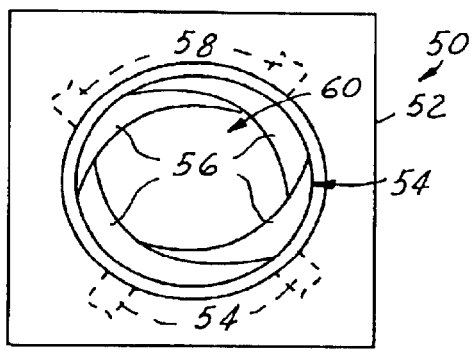
FIG. 3A is a front view of a mechanical shutter in implementation of the present invention, with the shutter blades dilated for increasing flow of electrons through the shutter.
Figure 3B:
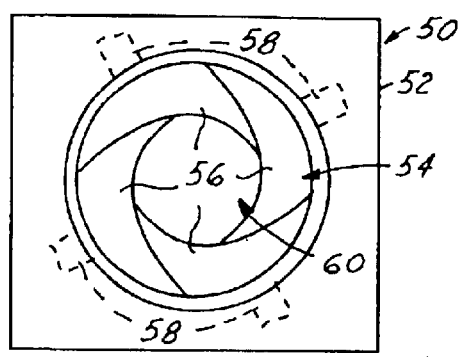
FIG. 3B is a front view of the mechanical shutter of FIG. 3A, with the shutter blades constricted for restricting flow of electrons through the shutter.

In accordance with the present invention, a mechanical shutter 50 is mounted in the discharge opening of the partition 35 for controlling the quantity of electrons flowing from the arc chamber 32 into the ion beam 46 in the beam guide tube 31, as hereinafter further described. As shown in FIGS. 3A and 3B, the mechanical shutter 50 may include a shutter housing 52, provided with a housing opening 54. Multiple, arcuate shutter blades 56 are slidably mounted in the shutter housing 52 along the edges of the housing opening 54, according to the knowledge of those skilled in the art. The shutter blades 56 define a shutter opening 60, the size of which can be varied to control the quantity of electrons flowing therethrough. Accordingly, the shutter blades 56 are capable of assuming the dilated configuration of FIG. 3A to permit flow of a relatively large quantity of electrons through the shutter opening 60, or assuming the constricted configuration of FIG. 3B to reduce flow of electrons through the shutter opening 60. Preferably, the shutter blades 56 are capable of assuming various degrees of dilation and restriction to provide gradations in the diameter of the shutter opening 60. Each of the shutter blades 56 is engaged by a blade actuating mechanism 58 which slides the shutter blades 56 between the dilated position of FIG. 3A and the constricted position of FIG. 3B, according to the knowledge of those skilled in the art.

In operation of the PFS 30, the voltage source 40 generates a current through the filament 42 in the chamber interior 33 of the arc chamber 32. Simultaneously, by operation of vacuum pressure induced in the arc chamber 32, a plasma-forming gas such as argon or xenon is introduced into the chamber interior 33 through the gas inlet opening or openings 38. The filament 42, heated by the current from the current source 40, causes thermionic emission of electrons from the flowing gas as the gas contacts the filament 42. The electrons from the gas are electrically attracted to the positively-charged chamber walls 34, which function as an anode. The torroidal magnet 36 generates a magnetic field which causes the electrons to travel in a spiral flight path in the chamber interior 33, and this increases the frequency of collisions between the electrons and the gas atoms, resulting in the creation of additional free electrons.

The generated electrons and positive ions are drawn from the chamber interior 33 through the shutter opening 60, where the electrons, cations and a surrounding plasma 48 enter the ion beam 46 in the beam guide tube 31. The ion beam 46 carries the electrons into contact with a substrate (not shown) which was previously subjected to an ion implantation process. Accordingly, the electrons contact the wafer and neutralize positive ions remaining on the surface of the substrate after the ion implantation process.

As the electrons flow from the chamber interior 33 of the arc chamber 32 through the shutter opening 60, the mechanical shutter 50 can be operated to position the shutter blades 56 at selected dialated or constricted configurations to define a selected size of the shutter opening 60. Accordingly, when the shutter blades 56 are positioned in the dilated position, such as that shown in FIG. 3A, a relatively large quantity of electrons are allowed to flow from the arc chamber 32 into the ion beam 46 in the beam guide tube 31. This provides a correspondingly large flood of electrons to the surface of the substrate to neutralize positive charges thereon. When the shutter blades 56 are positioned in a more constricted position, such as that shown in FIG. 3B, the shutter opening 60 has a correspondingly smaller size and thus, a smaller quantity of electrons is able to flow from the arc chamber 32 to the ion beam 46. Consequently, fewer electrons flood the substrate, and negative overcharging of the substrate surface can thus be avoided.

The controller 37 for the PFS system 30, or the ion implanter of which the PFS system 30 is a part, can be connected to the blade actuating mechanism or mechanisms 58 of the mechanical shutter 50, such as through suitable wiring 39, in order to automatically control the size of the shutter opening 60. Accordingly, the PFS 30 or the ion implanter of which the PFS 30 is a part sends an appropriate data signal to the controller 37 corresponding to the flow volume or other parameter which indicates the quantity of electrons flowing through the shutter opening 60 or flooding the surface of the substrate. This data signal is compared to control data in the controller 37 which represents the optimal quantity of electrons for the plasma flooding process. In the event that the number or quantity of electrons flooding the substrate exceeds the optimal control value, the controller 37 then operates to further constrict the shutter opening 60, such as is shown in FIG. 3B, by actuating the blade actuating mechanism 58 of the shutter blades 56. Conversely, in the event that the number or quantity of electrons flooding the substrate is less than the optimal control value, the controller 37 actuates the blade actuating mechanism 58 to dilate the shutter opening 60, as shown in FIG. 3A, in order to increase the quantity of electrons flooding the substrate.

Figure 4A:
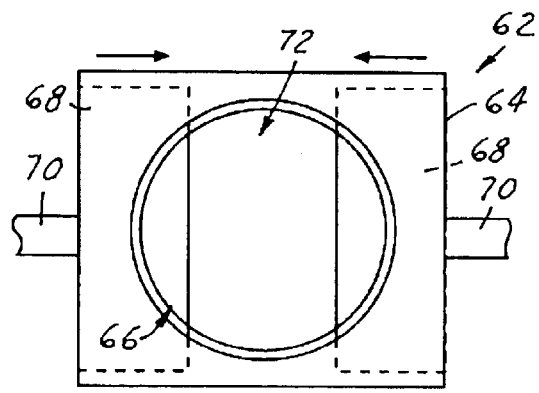
FIG. 4A is a front view of an alternative mechanical shutter in implementation of the present invention, with a pair of shutter plates positioned for increasing flow of electrons through the shutter.
Figure 4B:
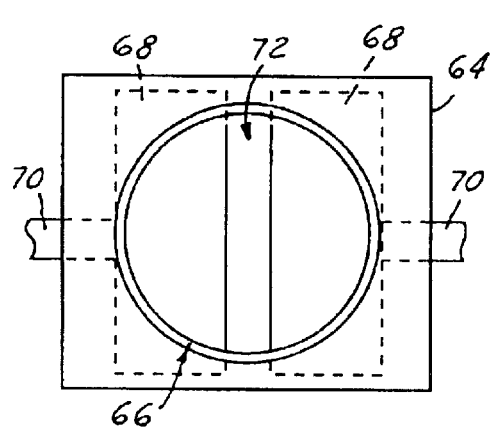
FIG. 4B is a front view of the mechanical shutter of FIG. 4A, with the shutter plates positioned for restricting flow of electrons through the shutter.

As shown in FIGS. 4A and 4B, the mechanical shutter 62 may have an alternative design in which each of a pair of shutter plates 68, which may be constructed of graphite, is slidably mounted in a shutter housing 64 to vary the size of a shutter opening 72 in a housing opening 66. Each of the shutter plates 68 is engaged by a plate actuating mechanism 70 which positions the blades between the position of FIG. 4A, in which the shutter opening 72 is dialated, and the position of FIG. 4B, in which the shutter opening 72 is constricted. Accordingly, the quantity of electrons flowing from the arc chamber 32 into the ion beam 46, and thus, the quantity of electrons flooding the substrate surface, is increased or maximized when the shutter plates 68 are positioned in the dilating configuration of FIG. 4A. Conversely, the quantity of electrons flowing from the arc chamber 32 into the ion beam 46, and thus, the quantity of electrons flooding the substrate surface, is decreased or minimized when the shutter plates 68 are positioned in the constricting configuration of FIG. 4B. As heretofore described with respect to the mechanical shutter 50 of FIGS. 3A and 3B, the plate actuating mechanism 70 of the mechanical shutter 62 may be operably connected to the controller 37 (FIG. 2) of the PFS 30 or ion implanter of which the PFS 30 is a part.

Figure 5:
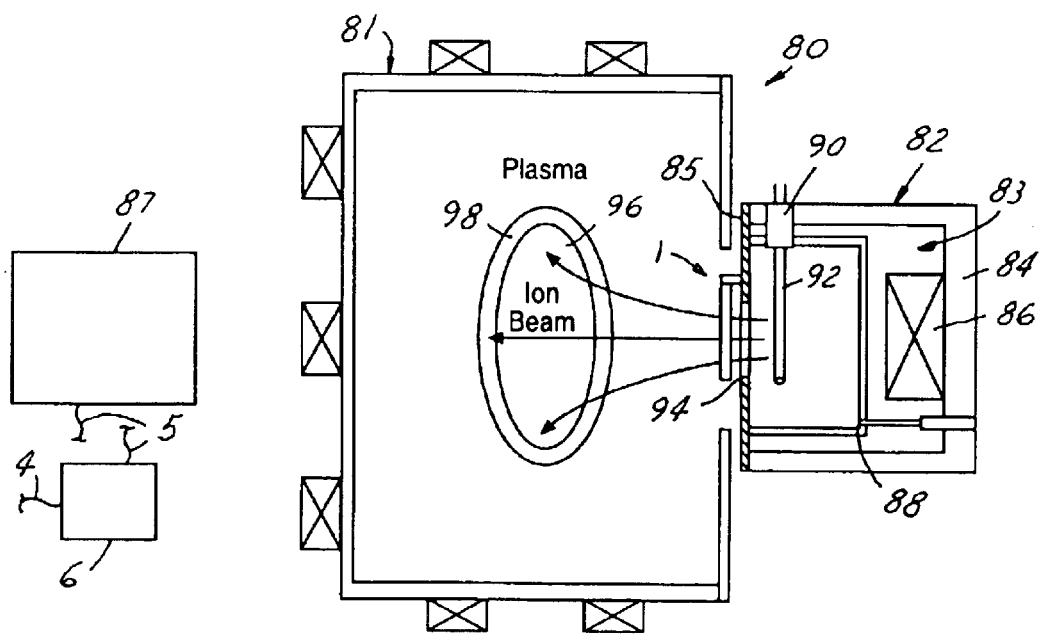
FIG. 5 is a schematic view illustrating a plasma flood system in implementation of another embodiment of the present invention.
Figure 6:
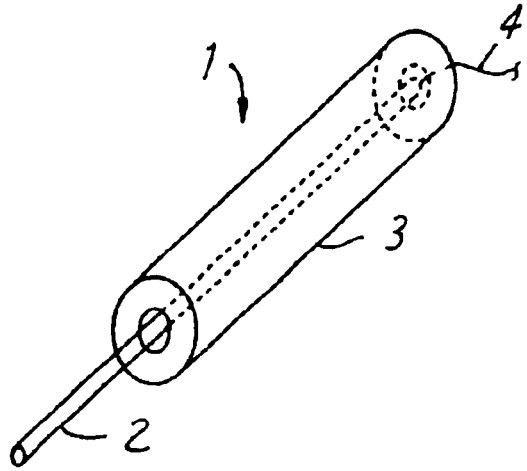
FIG. 6 is a perspective, partially schematic, view of a probe assembly used in operation of the plasma flood system of FIG. 5.
Figure 6:
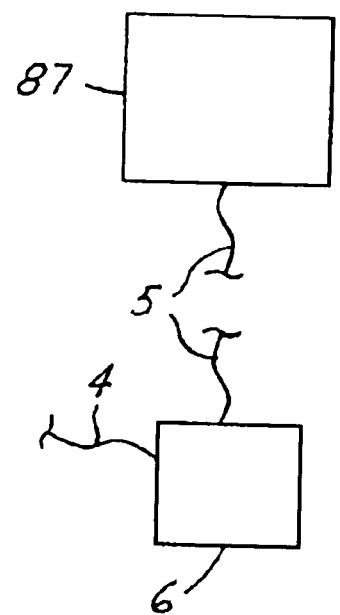

Referring next to FIGS. 5 and 6, a PFS system in implementation of another embodiment of the present invention is generally indicated by reference numeral 80 and includes an arc chamber 82 having a typically cylindrical chamber wall 84. One or multiple gas inlet openings 88 are provided in the chamber wall 84 for introducing argon or other plasma-forming gas into the chamber interior 83. A voltage source 90 is electrically connected to a filament 92 which may be tungsten and is positioned in the chamber interior 83. A torroidal magnet 86 may encircle the chamber interior 83. The PFS 80 may be automatically operated by a controller 87. A partition 85 separates the arc chamber 82 from a beam guide tube 81 of the PFS 80. A discharge opening 94 is provided in the partition 85 for facilitating flow of electrons from the arc chamber 82 into an ion beam 96 in the beam guide tube 81, in operation of the PFS 80 as hereinafter described.

In accordance with the present invention, a probe assembly 1 is mounted in or adjacent to the discharge opening 94 of the partition 85 for controlling the quantity of electrons flowing from the arc chamber 82 into the ion beam 96 in the beam guide tube 81, as hereinafter further described. As shown in FIG. 6, the probe assembly 1 includes an elongated, metal electrode or probe rod 2 which extends from a ceramic insulator 3, typically ceramic or boron nitride. Probe wiring 4 connects the probe rod 2 to a power supply 6 which applies a positive charge to the probe rod 2 for the attraction of electrons to the probe rod 2 as hereinafter described. The power supply 6 may further be connected to the controller 87 for the PSF 80 through controller wiring 5. Typically, the positive voltage applied to the probe rod 2 by the power supply 6 may be varied in order to vary the strength of attraction of electrons to the probe rod 2, and thus, the quantity of electrons which bind to the probe rod 2.

In operation of the PFS 80, the voltage source 90 generates a current through the filament 92 in the chamber interior 83 of the arc chamber 82 to cause thermionic emission of electrons from argon or xenon gas as the gas first flows into the chamber interior 83 through the gas inlet opening or openings 88 and then contacts the filament 92. The electrons from the gas are electrically attracted to the positively-charged chamber walls 84, which function as an anode. The torroidal magnet 86 generates a magnetic field which causes the electrons to travel in a spiral flight path in the chamber interior 83, and this increases the frequency of collisions between the electrons and the gas atoms, resulting in the creation of additional free electrons.

The generated electrons and positive ions are drawn from the chamber interior 83 through the discharge opening 94, where the electrons, cations and a surrounding plasma 98 enter the ion beam 96 in the beam guide tube 81. The ion beam 96 carries the electrons into contact with a substrate (not shown) which was previously subjected to an ion implantation process. Accordingly, the electrons contact the substrate and neutralize positive ions remaining on the surface of the substrate after the ion implantation process.

As the electrons flow from the chamber interior 83 of the arc chamber 82 through the discharge opening 94, the power supply 6 of the probe assembly 1 can be operated to apply a positive charge to the probe rod 2. Accordingly, when the power supply 6 is turned off and the probe rod 2 is electrically neutral, a relatively large quantity of electrons are allowed to flow from the arc chamber 82 into the ion beam 96 in the beam guide tube 81. This provides a correspondingly large flood of electrons to the surface of the substrate to neutralize positive charges thereon. When the power supply 6 is turned on and applies a positive charge to the probe rod 2, however, many of the electrons bind to the probe rod 2, and thus, a smaller quantity of electrons is able to flow from the arc chamber 82 to the ion beam 96. Consequently, fewer electrons flood the substrate, and negative overcharging of the substrate surface can thus be avoided. Preferably, the power supply 6 is capable of applying positive charges of various strengths to the probe rod 2 in order to facilitate the binding of various quantities of electrons to the probe rod 2.

The controller 87 for the PFS system 80 or the ion implanter of which the PFS system 80 is a part can be operated to automatically control the strength of the positive charge applied to the probe rod 2. Accordingly, the PFS 80 or the ion implanter of which the PFS 80 is a part sends an appropriate data signal to the controller 87 corresponding to the flow volume or other parameter which indicates the quantity of electrons flowing through the discharge opening 94 or flooding the surface of the substrate. This data signal is compared to control data in the controller 87 which represents the optimal quantity of electrons for the plasma flooding process. In the event that the number or quantity of electrons flooding the substrate exceeds the optimal control value, the controller 87 then operates the power supply 6 to apply a positive charge to the probe rod 2, such that a quantity of the electrons flowing through the discharge opening 94 bind to the probe rod 2. The rest of the electrons enter the ion beam 46 and flood the substrate. Conversely, in the event that the quantity of electrons flooding the substrate is less than the optimal control value, the controller 87 either operates the power supply 6 to decrease the strength of the positive charge on the probe rod 2 or terminates operation of the power supply 6 to impart electrical neutrality to the probe rod 2. Consequently, fewer or no electrons bind to the probe rod 2, and a correspondingly larger quantity of the electrons generated in the chamber interior 83 is thus available to enter the ion beam 96 and flood the substrate.

While the preferred embodiments of the invention have been described above, it will be recognized and understood that various modifications can be made in the invention and the appended claims are intended to cover all such modifications which may fall within the spirit and scope of the invention.

What is claimed is:

1. A system comprising:
    a first enclosure for generating electrons;
    a second enclosure provided in communication with said first enclosure for receiving the electrons; and
    an electron flow regulating mechanism comprises a mechanical shutter provided between said first enclosure and said second enclosure for regulating flow of the electrons from said first enclosure to said second enclosure, said mechanical shutter comprises a shutter housing having a housing opening and a plurality of shutter blades engaging said shutter housing for selectively constricting and dilating said housing opening.

2. The system of claim 1 further comprising a filament provided in said first enclosure, a voltage source provided in electrical contact with said filament and at least one gas inlet opening provided in said first enclosure for introducing a gas into said first enclosure, wherein said gas contacts said filament and the electrons are released from said gas.

3. The system of claim 1 wherein said mechanical shutter comprises a shutter housing having a housing opening and a plurality of shutter plates slidably engaging said shutter housing for selectively constricting and dilating said housing opening.

4. The system of claim 3 further comprising a filament provided in said first enclosure, a voltage source provided in electrical contact with said filament and at least one gas inlet opening provided in said first enclosure for introducing a gas into said first enclosure, wherein said gas contacts said filament and the electrons are released front said gas.

5. A method of controlling flow of electrons from a chamber for generating electrons to a beam guide tube for receiving the electrons, comprising the step of:
    providing an electron flow regulating mechanism comprises a mechanical shutter between said chamber and said beam guide tube for regulating said flow of electrons, said mechanical shutter comprises a shutter housing opening and a plurality of shutter blades engaging said shutter housing for constricting said housing opening to decrease said flow of electrons and dilating said housing opening to increase said flow of electrons.

6. The method of claim 5 further comprising a controller operably connected to said plurality of shutter blades for automatically constricting and dilating said housing opening responsive to input data.

7. The method of claim 5 wherein said mechanical shutter comprises a shutter housing having a housing opening and a plurality of shutter plates slidably engaging said shutter housing for constricting said housing opening to decrease said flow of electrons and dilating said housing opening to increase said flow of electrons.

8. The method of claim 7 further comprising a controller operably connected to said plurality of shutter blades for automatically constricting and dilating said housing opening responsive to input data.

9. The method of claim 5 wherein said electron flow regulating mechanism comprises a probe assembly comprising a probe rod, a power supply connected to said probe rod for imparting a positive charge to said probe rod, and an insulator carried by said probe rod.

10. The method of claim 9 further comprising a controller operably connected to said probe rod for automatically imparting said positive charge to said probe rod responsive to input data.

* * * * *